INDEPENDENTLY ADJUSTABLE MULTIOUTPUT VOLTAGE DIVIDER AND VOLTAGE RESPONSIVE CAPACITANCE TUNER UTILIZING SAME

Filed Jan. 15, 1969

INVENTOR

Richard S. Bagwell

BY

Ralph Hamman

ATTORNEY

United States Patent Office 3,551,820
Patented Dec. 29, 1970

3,551,820

INDEPENDENTLY ADJUSTABLE MULTIOUTPUT VOLTAGE DIVIDER AND VOLTAGE RESPONSIVE CAPACITANCE TUNER UTILIZING SAME

Richard S. Bagwell, Erie, Pa., assignor to Erie Technological Products, Inc., Erie, Pa., a corporation of Pennsylvania Filed Jan. 15, 1969, Ser. No. 791,284
Int. Cl. H03j *3/06;* H04b *1/16*
U.S. Cl. 325—465 15 Claims

ABSTRACT OF THE DISCLOSURE

A voltage divider having a plurality of independently selectable and adjustable taps in which selection of a tap activates a fine and coarse tuning adjustment for the selected tap. One use is to supply a voltage responsive condenser in a tuning circuit in order to tune the circuit to a given resonant frequency.

This application is an improvement on application Ser. No. 728,270 filed May 10, 1968, now abandoned, incorporated by reference. This invention is a voltage divider having a plurality of resistors and associated sliders, any one of which may be selected. A tuning mechanism may be actuated to adjust the selected slider independently of the other sliders.

Figure 1:
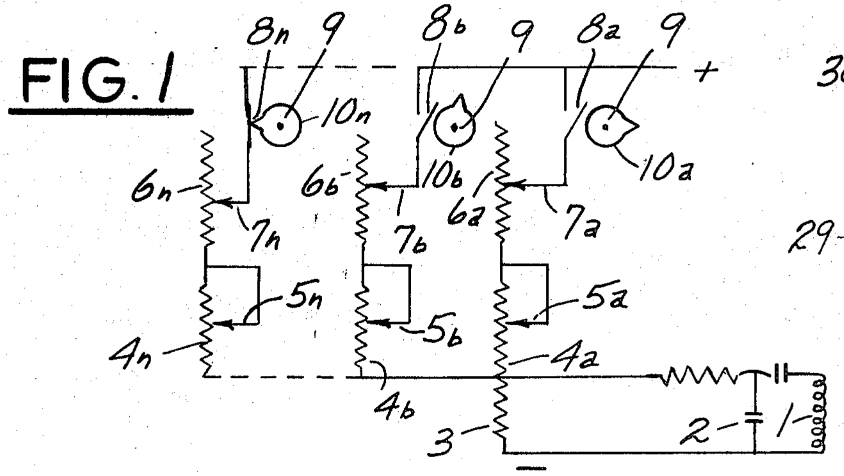
Figure 6:
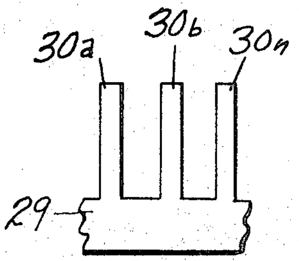
Figure 2:
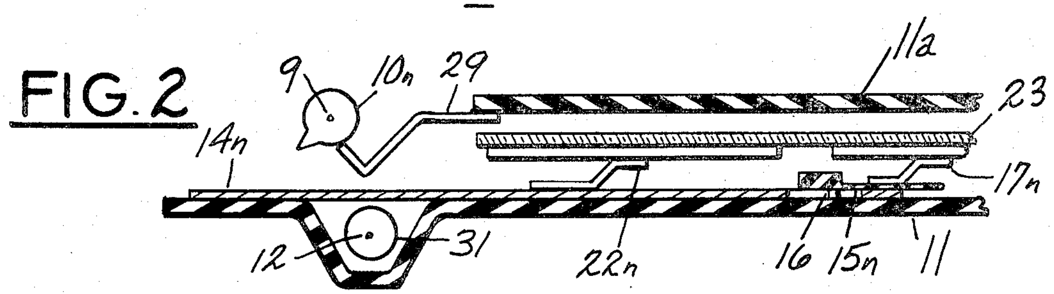
Figure 3:
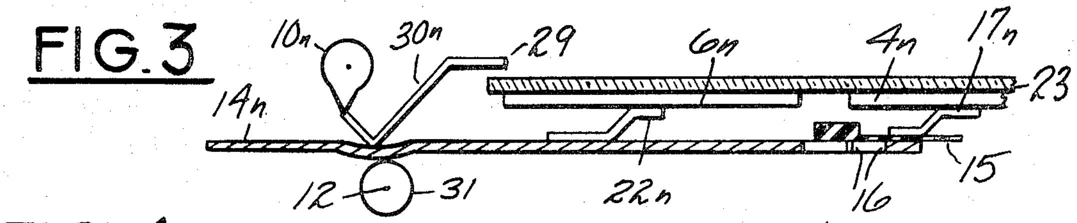
Figure 4:
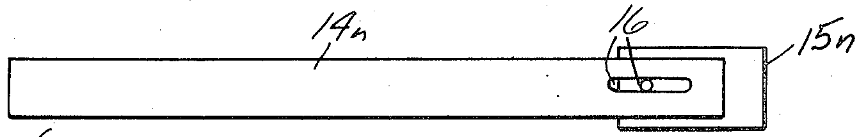
Figure 7:
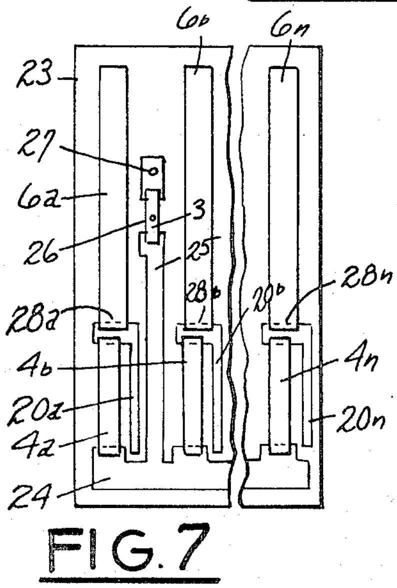
Figure 8:
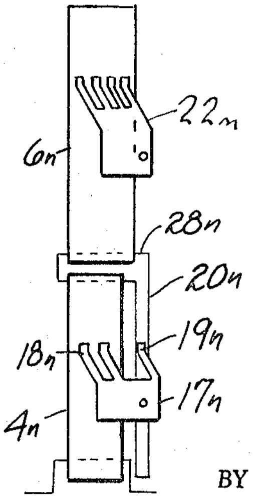
Figure 5:
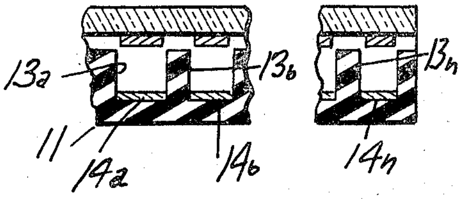

In the drawing, FIG. 1 is a diagrammatic view of a multiple channel circuit in which the tuning of each channel is effected by an independently adjustable voltage divider arranged so it may be connected to the tuning circuit which has a voltage responsive capacitor for tuning, FIG. 2 is a section through a combined selector switch and coarse and fine tuning adjustment, the section being taken through a portion of the switch in the disconnected or relaxed position; FIG. 3 is a section through the FIG. 2 switch in the connected or activated position; FIG. 4 is a bottom plan view of one of the wiper carriers; FIG. 5 is a fragmentary section through the wiper carriers and the associated substrate; FIG. 6 is a fragmentary plan view of the selector switch; FIG. 7 is a fragmentary plan view of the substrate, and FIG. 8 is a perspective showing the fine and coarse adjustment wipers and associated resistors for one of the channels.

Referring first to FIG. 1, there is shown a tuning circuit comprising an inductance 1, a voltage responsive capacitor 2, and a common output resistor 3 for any one of a plurality of independently adjustable resistors. The adjustable resistors in combination with the output resistor provide a plurality of voltage dividers, any one of which may be connected across the capacitor 2. The voltage output of the selected voltage divider produces a corresponding change in the magnitude of the capacitance and produces a corresponding change in the frequency of the tuning circuit. When applied to a radio or television set, the change in frequency can be used for station selection. FIG. 1 is merely a diagrammatic illustration of the principle of operation and is not intended to show the actual tuning circuit of a radio or television set.

Three voltage dividers are shown, each comprising a coarse tuning resistor 4*a*, 4*b* . . . 4*n* and its associated slider 5*a*, 5*b* . . . 5*n*, a fine tuning resistor 6*a*, 6*b* . . . 6*n* and its associated slider 7*a*, 7*b* . . . 7*n*, connected in series with common output resistor 3 and across a power supply by a switch 8*a*, 8*b* . . . 8*n*. Only one voltage divider is in use at a time. In FIG. 1 switch 8*n* is closed so that only the voltage divider 3, 4*n*, 5n, 6*n*, 7*n* is in use. The number of voltage dividers could, of course, be multiplied. For example, there might be twelve voltage dividers, one for each of the V.H.F. channels. Another arrangement might have eighteen voltage dividers, twelve for V.H.F. stations and six for U.H.F. or F.M. stations. Each voltage divider is adjustable for the desired fraction of the full range of the input voltage which may be A.C. or D.C.

The desired channel is selected by a channel selector shaft 9 having cams 10*a*, 10*b* . . . 10*n* respectively associated with a switch 8*a*, 8*b* . . . 8*n* to connect the selected voltage divider to the output resistor 3 across the voltage responsive capacitor 2. As shown in FIG. 1, the switch 8*n* is closed and the voltage from voltage divider 4*n*, 5*n*, 6*n*, 7*n* is connected across the capacitor 2. The cams 10*a*, 10*b* . . . 10*n* are angularly displaced on the channel selector shaft 9 so that only one of the switches 8*a*, 8*b* . . . 8*n* can be closed on time. The switches 8*a*, 8*b* . . . 8*n* are independent of the sliders 5*a*, 5*b* . . . 5*n*; 7*a*, 7*b* . . . 7*n* so that once the sliders are adjusted, the adjustment is unaffected by the operation of the switches and readjustment of the sliders is not necessary.

In FIGS. 2–8 inclusive is shown a voltage divider structure which when used in FIG. 1 will permit selecting any desired station or channel and which will provide the selected channel with an individual fine tuning which will remain adjusted after switching to other channels. The voltage divider is mounted in a housing 11, 11*a*, only part of which is shown, having suitably journaled therein the channel selector shaft 9 and a tuning shaft 12. On the upper side of the housing 11 are grooves 13*a*, 13*b* . . . 13*n*, one for each voltage divider. Each groove slidably receives a metal slider strip 14*a*, 14*b* . . . 14*n*, which normally rides on the bottom of its groove. There is sufficient friction between the slider strips and the associated grooves so that the individual slider strips will remain in any position to which they are adjusted. At one end of each of the slider strips, e.g., strip 14*n*, is a carrier 15*n* connected to the strip 14*n* by a pin and slot or other lost motion connection 16. Mounted on the carrier 15*n* is a wiper 17*n* (FIG. 8) having section 18*n* sliding on coarse adjustment resistor 4*n* and section 19*n* sliding on conductive strip 20*n*. The wiper 17*n* shorts out a portion of the coarse resistor 4*n* leaving the balance connected in series with fine adjustment resistor 6*n*. At the mid section of the strip 14*n* is a wiper 22*n* which makes contact with fine adjustment resistor 6*n*.

The coarse and fine resistors are painted or otherwise mounted on the underside of a suitable substrate of insulating material, e.g., ceramic plate 23 suitably supported in the housing 11, 11*a* so that each set of resistors 4*a*, 6*a*; 4*b*, 6*b*; . . . 4*n*, 6*n* registers with its slider 14*a*, 14*b* . . . 14*n*. The lower end of each resistor 4*a*, 4*b* . . . 4*n* is connected by a metal bus 24 and conductor 25 to load resistor 3, terminals 26 and 27 being provided for connection to the voltage sensitive capacitor 2. Metal strips 20*a*, 20*b* . . . 20*n* have enlarged upper ends 28*a*, 28*b* . . . 28*n* connecting the adjacent ends of resistors 4*a*, 6*a*; 4*b*, 6*b* . . . 4*n*, 6*n*. Adjustment of each slider along its groove moves its wiper along the associated resistors. For example, movement of the slider 14*n* of FIG. 3 moves wiper 22*n* along resistor 6*n* and wiper 17*n* along resistor 4*n* so as to vary the voltage output. The lost motion or pin and slot connection 16*n* causes movement of the coarse adjustment wiper 17*n* after the lost motion is taken up. The length of each of the grooves 13*a*, 13*b* . . . 13*n* is preferably such as to permit movement of its slider along substantially the full length of its associated resistors. Suitable stops (not shown) limit the movement of the sliders so that the contact wipers never move wholly off the associated resistors.

The position or orientation of the housing does not affect the operation. It can be inverted or tilted at any angle without affecting the operation.

Selection of the desired voltage output is made through a switch member 29 having a plurality of spring fingers 30*a*, 30*b* . . . 30*n* each arranged above a different one of the metal slider strips 14*a*, 14*b* . . . 14*n*. Mounted on the selector shaft 9 are a plurality of cams 10*a*, 10*b* . . . 10*n* angularly displaced from each other. Each cam is associated with a different spring finger. In the FIG. 3 position, one of the cams 10*n* is shown in the circuit closing position in which its metal spring finger 30*n* is pressed into contact with the associated slider strip 14*n*. This not only establishes an electrical connection to the slider 14*n* but it also presses the slider into friction engagement with a rubber clutch surface 31 on the tuning shaft 12. Other clutch surfaces may be provided on the shaft 12 and on the sliders. By rotating the fine tuning shaft 12 by means of a suitable knob (not shown) the slider which is frictionally engaged can be adjusted to the position supplying the voltage needed. Tuning is possible only when the cam for the selected slider is in the FIG. 3 position where the tuning shaft is clutched to the selected slider and the other sliders are declutched. Once adjusted, the tuning remains in its adjusted position (has memory) and is not changed or disturbed by switching to other sliders. The fingers of the switch 29 are normally open so the voltage dividers do not draw current in the off position. Only the particular voltage divider for the selected circuit is energized.

What is claimed as new is:

1. A device for producing a plurality of independently selectable adjustable voltages comprising, a plurality of resistor means each connectable across a voltage supply, a plurality of adjustable means respectively associated with each resistor means for tapping a portion of the voltage drop appearing across its resistor means, selector means for selecting the resistor means whose voltage is to be tapped, normally released clutch means for the adjustable means of each resistor means, means actuated by said selector means for conditioning the clutch means of only the selected resistor means for engagement whereby adjustment of only the adjustable means of the selected resistor means may be made.

2. The device of claim 1 in combination with a frequency determining circuit having a voltage responsive capacitor and circuit connections for connecting the voltage tapped from the selected resistor means to said capacitor to vary its capacitance and thereby vary the frequency of said circuit.

3. The device of claim 2 in which the frequency determining circuit is the tuning circuit of a radio or television receiver.

4. The device of claim 1 in which the clutch means includes a shaft common to a plurality of said resistor means whereby upon engagement of the clutch means of a particular resistor means its adjustable means may be adjusted by the shaft.

5. The device of claim 1 in which the adjustable means for each resistor means comprises a metal strip having voltage tapping wiper means riding on its resistor means.

6. The device of claim 5 having a housing having grooves for slidably receiving and frictionally holding the metal strips whereby the strips remain in adjusted position.

7. The device of claim 5 in which the selector switch has a finger for each strip which effects the selection of the resistor means whose voltage is to be tapped by engaging such strip.

8. The device of claim 5 in which the clutch means for the selected resistor means includes a shaft having a friction surface engaged by its strip whereby movement of the shaft adjusts its strip.

9. The device of claim 1 in which the adjustable means for each resistor means comprises a metal strip carrying a voltage tapping wiper means sliding on its resistor means, the metal strips being arranged generally parallel to each other, a housing having generally parallel grooves each receiving one of the strips, the selector switch means having a finger for each strip, the fingers being normally spaced from the strips, and a selector shaft having associated cam means for moving any desired finger into contact with its strip.

10. The device of claim 9 in which the clutch means comprises a tuning shaft having a friction surface normally spaced from said strips and means for engaging said friction surface with the strip selected by said selector shaft.

11. The device of claim 1 in which each resistor means is normally connected to the voltage supply through a normally open switch and the selector means includes means for closing the switch of the selected resistor means.

12. The device of claim 1 in which each resistor means includes an output resistor common to the other resistor means.

13. The device of claim 1 in which each resistor means includes a fine adjustment resistor and a coarse adjustment resistor connected in series and the adjustable means includes separate wipers for the resistors and an actuator for the wipers associated with each resistor means, a direct driving connection from the actuator to the wiper for the fine adjustment resistor and a lost motion driving connection from the actuator to the wiper for the coarse adjustment resistor.

14. The device of claim 1 in which each resistor means includes a fine adjustment resistor and a coarse adjustment resistor connected in series and the adjustable means for each resistor means comprises a metal strip conductively connected to a wiper for the fine adjustment resistor and nonconductively connected to a wiper for the coarse adjustment resistor.

15. The device of claim 14 in which the nonconductive connection to the wiper for the coarse adjustment resistor is a lost motion connection.

References Cited

UNITED STATES PATENTS

| | | | |
|---|---|---|---|
| 2,359,160 | 9/1944 | Sauter | 323—73X |
| 3,365,692 | 1/1968 | Sartain | 338—160 |
| 3,391,333 | 7/1968 | Steinert et al. | 323—81X |

ROBERT L. GRIFFIN, Primary Examiner

JAMES A. BRODSKY, Assistant Examiner

U.S. Cl. X.R.

334—14, 15; 323—80, 81, 94; 338—179, 198